United States Patent [19]

Salem

[11] 4,196,406
[45] Apr. 1, 1980

[54] ULTRASONIC CONTROL DEVICE

[75] Inventor: Robert J. Salem, Danbury, Conn.

[73] Assignee: General Electric Company, New York, N.Y.

[21] Appl. No.: 914,527

[22] Filed: Jun. 12, 1978

[51] Int. Cl.$^2$ .................. G01D 21/00; H01P 1/02; H03H 7/30

[52] U.S. Cl. ..................... 333/141; 116/205; 219/413; 310/335; 116/137 A

[58] Field of Search ............ 116/137 A; 310/334, 310/335; 307/117; 333/30 R; 200/181; 219/413

[56] References Cited

U.S. PATENT DOCUMENTS

| | | | |
|---|---|---|---|
| 2,407,294 | 9/1946 | Shockley et al. | 310/334 X |
| 2,505,364 | 4/1950 | McSkimin | 310/334 X |
| 2,826,745 | 3/1958 | Page | 333/30 R |
| 2,979,022 | 4/1961 | Adel | 116/137 A |
| 3,145,355 | 8/1964 | Wright | 310/334 X |
| 3,834,233 | 9/1974 | Willis et al. | 73/290 V |
| 3,935,485 | 1/1976 | Yoshida et al. | 200/181 X |
| 3,940,637 | 2/1976 | Ohigashi et al. | 200/181 X |

*Primary Examiner*—Daniel M. Yasich
*Attorney, Agent, or Firm*—Carlos Nieves; George R. Powers; Leonard J. Platt

[57] ABSTRACT

A control device includes a housing having a serpentinely disposed channel and a cover, secured to the housing, which converts the channel into an ultrasonic waveguide. One end of the waveguide is bounded by a stationary reflector and the other end of the waveguide communicates with a bore which holds a piezoelectric device matched to the waveguide so as to provide therein, when actuated, a propagating transverse wave in the ultrasonic frequency range. The cover includes three elongated slots, each of which slidably supports a different reflector unit. Each unit has a reflector extending into the waveguide and can be positioned anywhere along its corresponding slot. Actuation of the piezoelectric transducer by an electrical pulse causes an ultrasonic pulse to propagate down the waveguide and parts thereof are reflected back to the transducer where an electrical group of pulse signals are caused to appear. Each signal of the group is delayed with respect to the applied signal, the delay of each signal being related to the position of a different one of the reflectors.

13 Claims, 4 Drawing Figures

ULTRASONIC CONTROL DEVICE

The subject invention generally relates to electromechanical control devices of the type used to provide electrical signals in response to operator-executed manipulations or inputs. In addition, the invention relates to control devices such as disclosed in co-pending U.S. patent application Ser. No. 914,526, Ultrasonic Touch Control Panel, filed on June 12, 1978, on an invention by Robert J. Salem, the application having been assigned to the assignee herein, the General Electric Company.

Prior art considered relevant to the invention disclosed hereinbelow is described in U.S. Pat. No. 3,834,233, which relates to apparatus for monitoring the surface level of liquid in a container. The apparatus disclosed includes an ultrasonic waveguide vertically extending into the container, the lower end of the waveguide being located so as to be below the lowest liquid surface expected to be measured. Vents in the waveguide cause the liquid surface within the waveguide to settle at the same level as the liquid surface in the container and, as described below, is monitored to provide the information desired. The waveguide supports at its upper end a transceiver which periodically generates pulses of ultrasonic vibrations, and, at a fixed distance below the upper end, an ultrasonic transducer. In operation, the ultrasonic pulses propagate down the waveguide and, as any given pulse moves down the waveguide, it strikes the transducer and continues towards the liquid surface where it is reflected back to the transceiver. The period of time between transmitted pulses is sufficient to allow the return of a reflected pulse to the transceiver before the next of the periodic pulses is transmitted. In response to incident pulses the transceiver and transducer provide electrical signals which are processed to provide a transit time ratio and, since the distance from the transceiver to the transducer is fixed, a periodic measure of the distance from the transceiver to the surface of the liquid in the container. Transit time ratios are processed by the apparatus so as to make the distance measurement independent of the speed of propagation of the pulses, which speed is sensitive to the temperature of whatever gas is located above the liquid level in the waveguide. The patent also discloses that the transducer can be replaced by a reflector and that reflected signals, from the reflector and liquid surface, incident on the transceiver can be similarly processed to provide a measure of distance to the liquid surface in the waveguide.

Persons involved in producing consumer products of the type wherein operation of the product requires one or more operator inputs are aware that potentiometer circuits, electrical switches and electrical switch arrays can be used to control product functions. These persons are also aware that these control devices are expensive to buy, make, or use and contribute substantially to the costs of manufacturing the products.

It is an object of the present invention to provide a control device which is inexpensive to manufacture or to incorporate in another product.

It is another object of the present invention to provide a control device which utilizes ultrasonic echo ranging as a primary means of retrieving command information supplied to the device by an operator. It is yet another object of the present invention to provide a control device responsive to applied electrical pulses for providing a group of delayed electrical pulses per applied pulse, the amount of delay for each pulse of the group being subject to control by an operator.

Briefly, a control device, according to the invention, includes: an ultrasonic waveguide; an ultrasonic transducer coupled to the waveguide; and two or more ultrasonic wave reflectors coupled to the waveguide. The transducer is capable of providing, in response to an applied electrical pulse, an ultrasonic wave pulse which is suitable for propagation along a propagation path in the waveguide; and each of the reflectors is movable to different selectable positions along the propagation path, each reflector being suitable for reflecting a part of a propagating ultrasonic wave pulse back to the transducer. The transducer is capable of responding to such reflected pulses to sequentially provide a group of electrical pulses. With respect to said applied electrical pulse, each of the sequentially provided pulses occurs with a time delay related to the position of a different one of the reflectors.

As will become apparent, control devices incorporating the invention are, relative to functionally equivalent potentiometer circuits or switch arrays, inexpensive to manufacture.

Additional objects and features of the invention will become apparent after the following description of a device incorporating the invention is considered in conjunction with the accompanying drawings, in which.

Figure 1:
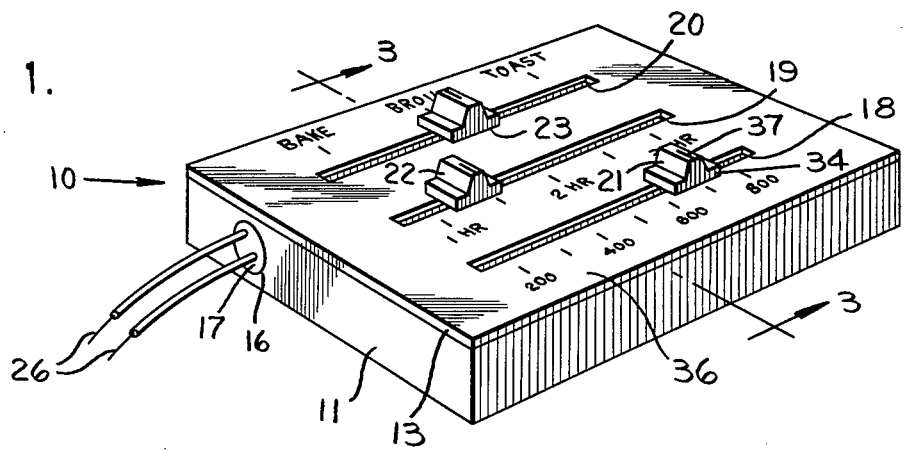
FIG. 1 is a perspective view of a control device, according to the invention.
Figure 2:
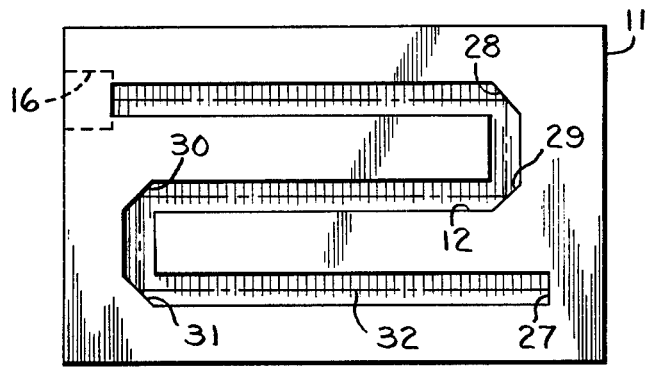
FIG. 2 is a top plan view of a housing of the control device.
Figure 3:
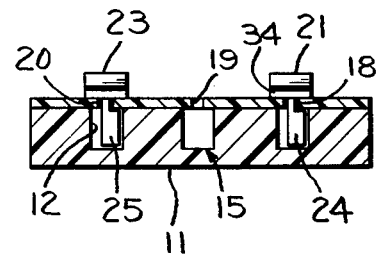
FIG. 3 is a cross-sectional view of the control device, taken along line 3—3 in FIG. 1.

A control device 10 embodying the invention is shown in FIGS. 1, 2, and 3. As shown in these figures, control device 10 includes a housing 11 having a channel 12, and a cover 13 secured to the housing to provide an ultrasonic waveguide 15. One end of the waveguide communicates with a bore 16 in the housing, which bore is used to hold an ultrasonic transducer 17. In the embodiment, transducer 17 is a piezoelectric device matched to the waveguide so as to provide therein, when actuated, a propagating transverse wave in the ultrasonic frequency range. Cover 13 includes three parallel slots 18, 19, 20 located so as to be aligned and in communication with linear sections of the waveguide. Slots 18, 19, 20 are engaged by and slidably support three reflector units 21, 22, 23, respectively, each of the units including an ultrasonic wave reflector 24, 25 (not all shown) extending into the waveguide and being movable along a different longitudinal section of the propagation path defined by the waveguide. Actuation of transducer 17 by the application of an electrical pulse across wires 26 causes an ultrasonic wave pulse to propagate through the waveguide and, as the pulse moves through the waveguide, parts thereof are reflected back towards the transducer by each of the reflectors. In a typical mode of operation of the device, the duration of the transmitted ultrasonic pulse is such that transmission has terminated before the first of the reflected pulses is incident on the transducer and, as a result, sequentially arriving reflected pulses cause a group of electrical pulses to appear across the wires 26. The delay of each pulse in the group with respect to the applied pulse which actuates the transducer is related to the location of a different one of the reflectors. It should be noted that information related to the instantaneous location of of each of the reflectors is retreivable with a single ultrasonic pulse and that the location of reflectors can be monitored continually through the periodic application of pulses to the transducer. For this purpose, a piezoelectric transducer operating at 5 Mhz. can be used to provide, in a waveguide having a propagation length of 225 millimeters, a periodic pulse having a width of 100 nanoseconds and a repetition rate of 10 pulses per second. It should also be noted that the amount of information which can be stored in devices of the type described is related to the number of reflectors used in a particular device.

Device 10 includes a stationary reflector 27 which is located at an end of the waveguide. Therefore, when an ultrasonic pulse, as previously described, is caused to propagate through the waveguide by the transducer, parts of the pulse are reflected by the movable reflectors back towards the transducer and still another part of the pulse is reflected back to the transducer by the fixed reflector. The part of the transmitted pulse which is returned to the transducer by reflector 27 travels a fixed distance along the propagation path of the waveguide and generates an electrical pulse, hereafter referred to as a reference pulse. The velocity of propagation of ultrasonic pulses through waveguide 15 is temperature dependent and, therefore, measured delay times for the group of pulses are related to the position of the reflectors associated with units 21, 22, 23 but vary with temperature. As will appear, the reference pulse may be processed with the group of pulses to accurately determine the location of the reflectors. A reference pulse can be provided by a stationary reflector located at other than the end of the waveguide but the end is preferred because it can be a wall which also prevents entry of extraneous ultrasonic signals into the waveguide.

Referring to FIGS. 2 and 3, waveguide 15 has a serpentine configuration composed of orthogonally connected straight waveguide sections, each orthogonal connection including a reflecting surface 28-31 so as to define a piecewise linear propagation path 32 for pulses provided by the transducer. The use of a serpentine configuration for the waveguide results in a compact device.

Reflector unit 21, as shown in FIGS. 1 and 3, comprises a handle having a flat section 34 and reflector 24. Reflector 24 is a rectangular member having a rectangular projection adapted to extend through slot 18 and to perpendicularly engage the flat section. The rectangular member and the flat section cooperate to limit transverse motion of the unit with respect to cover 13 and slot 18 is in sliding relationship with the projection to permit translation of unit 21 along slot 18. To allow an operator to accurately locate the reflector along a length of the propagation path and to indicate or identify the location, reference marks 36 are disposed along on the outside of cover 13, along slot 18, and a mark 37 is placed on the flat section so as to be alignable with any one of the reference marks. As shown in FIG. 1, reference marks 36 are, in the subject embodiment, associated with indicia related to temperature, a function which, as will appear, is to be controlled by the device. Marks on reflector units 22 and 23 are similarly associated with reference marks on the cover.

Figure 4:
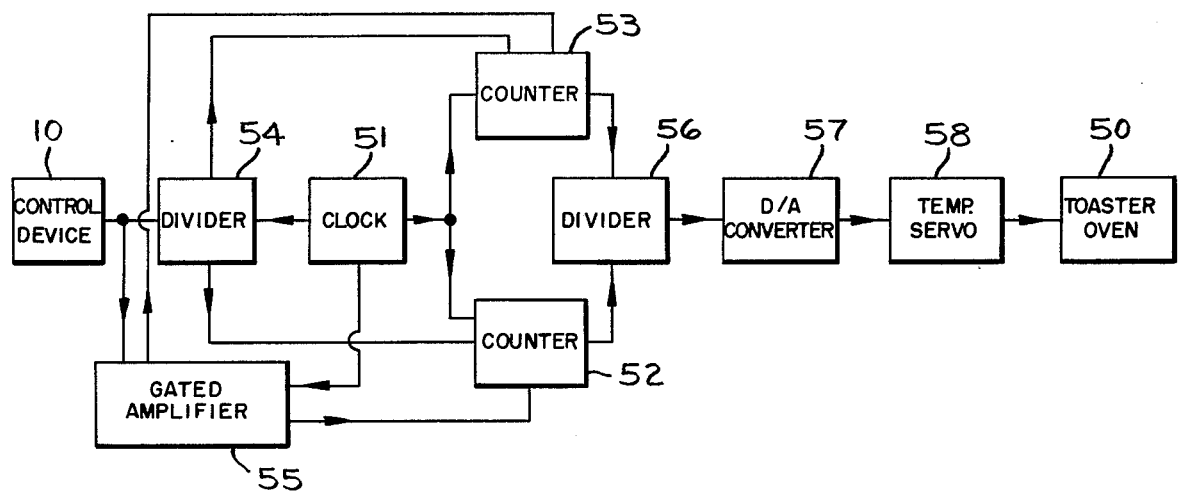
FIG. 4 is a block diagram of a typical electronic system associated with the control device.

Device 10 may be used to control, for example, a toaster oven and in the subject embodiment the cover 13 includes indicia associating mode of operation i.e., bake, broil, or toast, with reflector unit 23. The indicia also associates cooking time with reflector unit 22, and temperature with reflector unit 21. A block diagram of typical circuitry for coupling the device 10 to a toaster over 50 to control its temperature is shown in FIG. 4. Referring to FIG. 4, a system clock 51 provides pulses to a gated counter 52, to a gated counter 53, and to a divider 54. Divider 54 responds to pulses from the clock and periodically applies a pulse to wires 26 (see FIG. 1) of the device, whereby an ultrasonic pulse is transmitted into the waveguide by transducer 17. The periodic pulses are also applied to a gated amplifier 55, and to counters 52 and 53. Each pulse applied by divider 54 to counters 52 and 53 clears and starts then counting. Clock 51 controls gates in the amplifier 55 to distribute electrical signals provided at wires 26 as a result of ultrasonic reflections. For example, a reference electrical signal caused by reflector 27 is gated to the counter 53 to halt and store a count and an electrical signal related to the position of reflector unit 21 is gated to counter 52 to halt and store another count. The outputs of counters 52 and 53 are coupled to a divider 56 which provides a ratio dependent on the setting of the reflector unit 21. Assuming that temperature variations along the propagation path are negligible, the ratio is substantially independent of the temperature in the waveguide. The ratio is applied to a digital to analog converter 57 which provides a command signal to a temperature servosystem 58 of the oven 50, whereby oven temperature is controlled. Artisans in the electronic circuit art will appreciate that substantially temperature independent ratios can be provided for position settings of reflector units 22 and 23. The ratio associated with reflector unit 22 can be used to control an oven timer and the ratio associated with reflector unit 23 can be used, for example, with a comparator to control mode selection switched associated with the oven.

Device 10 can be modified in many ways. For example, a circular waveguide in a straight or curved configuration can be used with similar or different reflector units. Therefore, it is to be understood that the description herein of a device embodying the invention has been set forth as an example thereof and is not to be construed or interpreted to provide limitations on the claims which follow and define the invention.

What is claimed is:

1. A control device including a housing, said control device being responsive to applied electrical pulses for providing a group of delayed electrical pulses per applied pulse, the amount of delay for each pulse of said group being subject to control by an operator, comprising:
    (a) an ultrasonic waveguide;
    (b) an ultrasonic transducer mounted in a wall of the control device housing and coupled to the waveguide, the transducer being capable of providing, in response to an applied electrical pulse, an ultrasonic wave pulse which is suitable for propagation along a propagation path in the waveguide; and
    (c) a plurality of movable ultrasonic wave reflectors coupled to the waveguide, each of the reflectors being movable to different selectable positions along the propagation path, each of said reflectors being of a width less than the width of the waveguides and being suitable for reflecting a part of a propagating ultrasonic wave pulse back to the transducer, the transducer being capable of responding to such reflected pulses sequentially to provide a group of electrical pulses; whereby each of the sequentially provided pulses occurs with a time delay, relative to an applied pulse, related to the position of a different one of the said reflectors relative to said transducer.

2. A control device as defined in claim 1, further including a stationary reflector positioned along and perpendicular to the propagation path of the waveguide, whereby when an electrical pulse is applied to the transducer a delayed reference pulse relfected from said stationary reflector is caused to appear at the transducer.

3. A control device as defned in claim 2 wherein the statinary reflector is a wall located at an end of the waveguide.

4. A control device as defined in claim 1 wherein the waveguide provides a non-linear propagation path.

5. A control device as defined in claim 4 wherein the propagation path has a serpentine configuration.

6. A control device as defined in claim 4, further including a stationary reflector positioned along the propagation path of the waveguide, whereby when an electrical pulse is applied to the transducer a delayed reference pulse is caused to appear at the transducer.

7. A control device as defined in claim 6 wherein the stationary reflector is located at an end of the waveguide and wherein the propagation path has a serpentine configuration.

8. A control device as defined in claim 1 wherein one of said reflectors is mounted for movement along a first section of the propagation path and another one of said reflectors is mounted for movement along a second section of the propagation path, said first and second sections extending along different parts of the propagation path.

9. A control device as defined in claim 8, further includng a stationary reflector positioned along the propagation path of the waveguide but outside of said first and second sections, whereby when an electrical pulse is applied to the transducer a delayed reference pulse reflected from said stationary reflector is caused to appear at the transducer.

10. A control device as defined in claim 9 wherein the stationary reflector is located at an end of the waveguide.

11. A control device as defined in claim 8, wherein the waveguide provides a non-linear progagation path.

12. A control device as defined in claim 11, further including a stationary reflector located at an end of the waveguide.

13. A control device as defined in claim 8, further including means for indicating the location of said one of the reflectors along said first section of the propagation path.

* * * * *